United States Patent
Safir

(10) Patent No.: US 8,790,951 B2
(45) Date of Patent: Jul. 29, 2014

(54) LAMINATING ASSEMBLY

(75) Inventor: Yakov Safir, Frederiksberg (DK)

(73) Assignee: Saphire Solar Technologies APS, Rungsted Kyst (DK)

( * ) Notice: Subject to any disclaimer, the term of this patent is extended or adjusted under 35 U.S.C. 154(b) by 304 days.

(21) Appl. No.: 13/262,902

(22) PCT Filed: Apr. 7, 2010

(86) PCT No.: PCT/EP2010/054601
§ 371 (c)(1),
(2), (4) Date: Nov. 18, 2011

(87) PCT Pub. No.: WO2010/115930
PCT Pub. Date: Oct. 14, 2010

(65) Prior Publication Data
US 2012/0129292 A1    May 24, 2012

(30) Foreign Application Priority Data
Apr. 8, 2009 (EP) .................................. 09388010

(51) Int. Cl.
*H01L 21/00* (2006.01)

(52) U.S. Cl.
USPC .......................................... 438/64; 136/256

(58) Field of Classification Search
USPC ........ 438/57, 64; 156/285, 359, 382; 136/256
See application file for complete search history.

(56) References Cited

U.S. PATENT DOCUMENTS 5,593,532 A * 1/1997 Falk et al. ..................... 156/285
5,993,582 A * 11/1999 Yoshino et al. ............... 156/104
6,149,757 A    11/2000 Chikaki et al.
6,336,775 B1   1/2002 Morita et al.
6,367,530 B1   4/2002 Shimotomai
6,781,684 B1   8/2004 Ekhoff
(Continued)

FOREIGN PATENT DOCUMENTS

DE    4233611    4/1994
DE    10048974   4/2002
(Continued)

OTHER PUBLICATIONS

International Search Report on corresponding PCT application (PCT/EP2010/054601) from International Searching Authority (EPO) dated Jun. 16, 2010.
(Continued)

*Primary Examiner* — Brook Kebede
(74) *Attorney, Agent, or Firm* — Klein, O'Neill & Singh, LLP

(57) ABSTRACT

A carrier assembly is provided for solar cell laminates that include an encapsulating layer and that are conveyed through a lamination plant having a conveying surface. The assembly includes a housing of heat conductive material defining an inner volume, the housing having an upper plate for receiving the laminates and a lower plate defining a plurality of apertures, the inner volume including at least one connecting element interconnecting the first and second plates. An air supply system provides a continuous outward air flow through the apertures when the lower plate is received on the conveying surface, wherein the airflow yields an elevated pressure on the lower plate for providing lift to the housing, allowing substantially friction-free movement of the housing relative to the conveying surface. A thermal transfer system provides thermal energy to the upper plate for melting and curing the encapsulating layer.

18 Claims, 7 Drawing Sheets

(56) References Cited

U.S. PATENT DOCUMENTS

2005/0217718 A1\* 10/2005 Dings et al. ............... 136/256
2008/0117551 A1   5/2008 Brackley et al.
2008/0241402 A1  10/2008 Matsuoka et al.
2008/0295956 A1\* 12/2008 Damm et al. ............... 156/285

FOREIGN PATENT DOCUMENTS

| | | |
|---|---|---|
| EP | 1517585 | 3/2005 |
| EP | 1920922 | 5/2008 |
| JP | 9141743 | 6/1997 |

OTHER PUBLICATIONS

Written Opinion on corresponding PCT application (PCT/EP2010/054601) from International Searching Authority (EPO) dated une 16, 2010.

\* cited by examiner

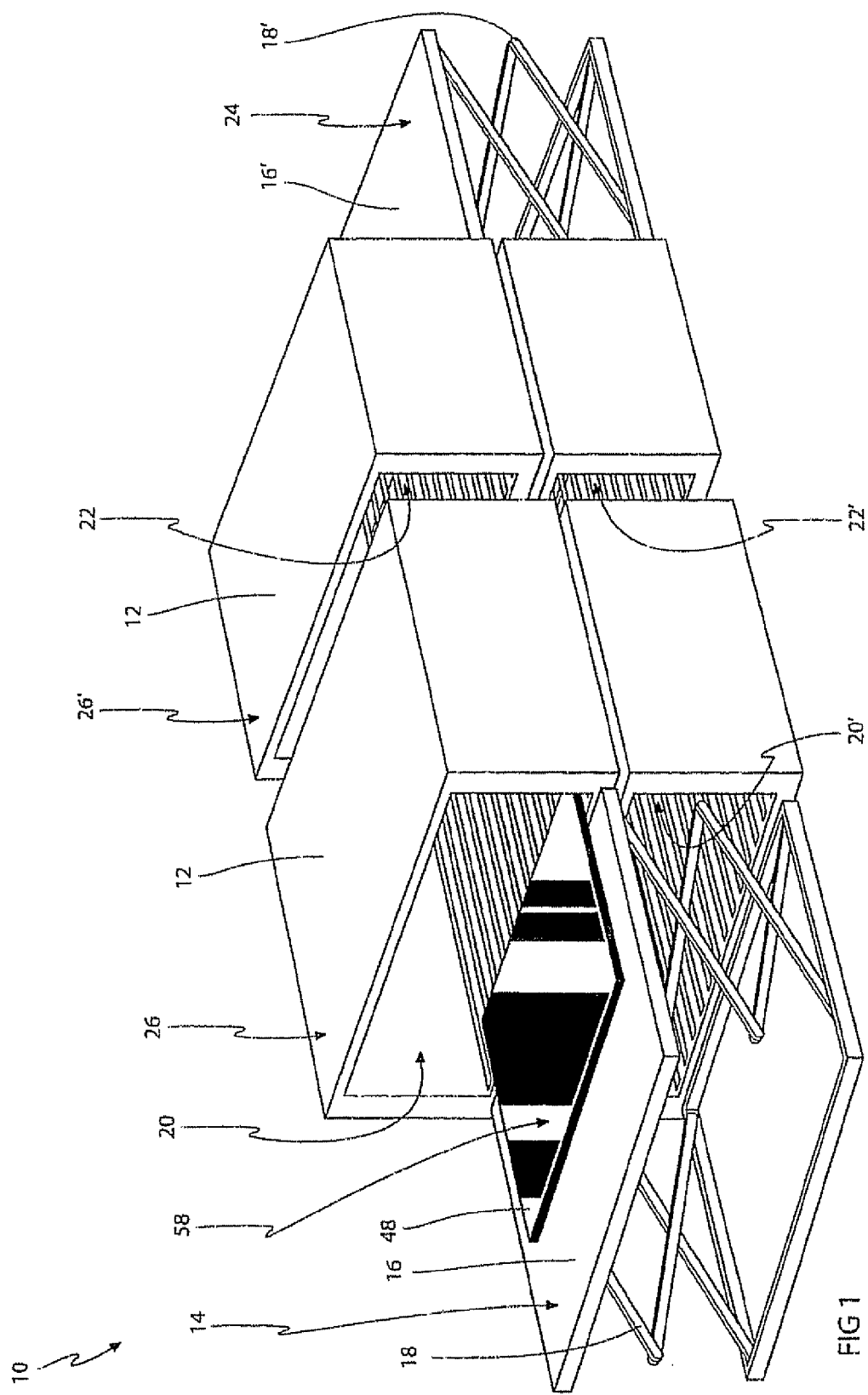

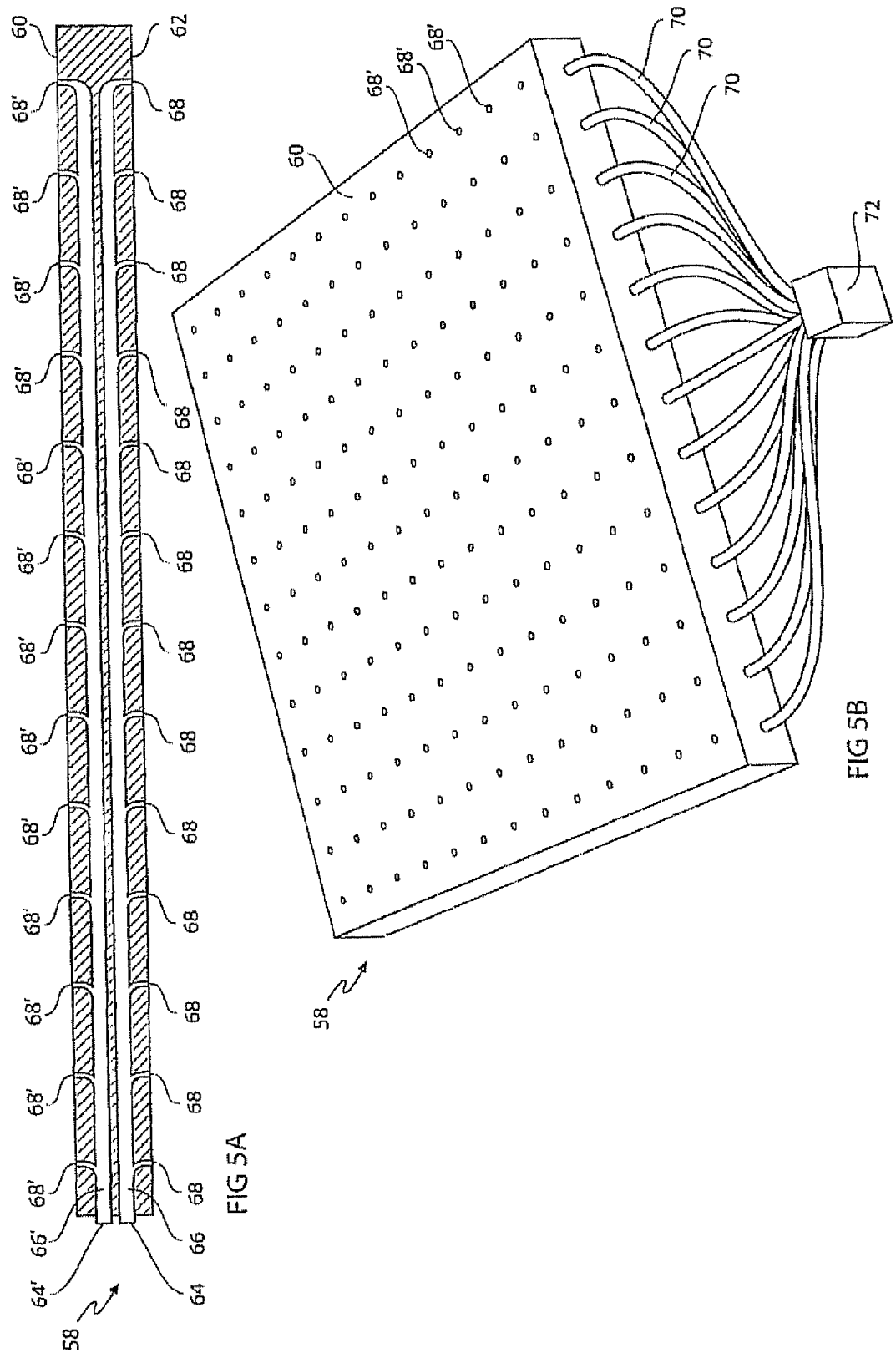

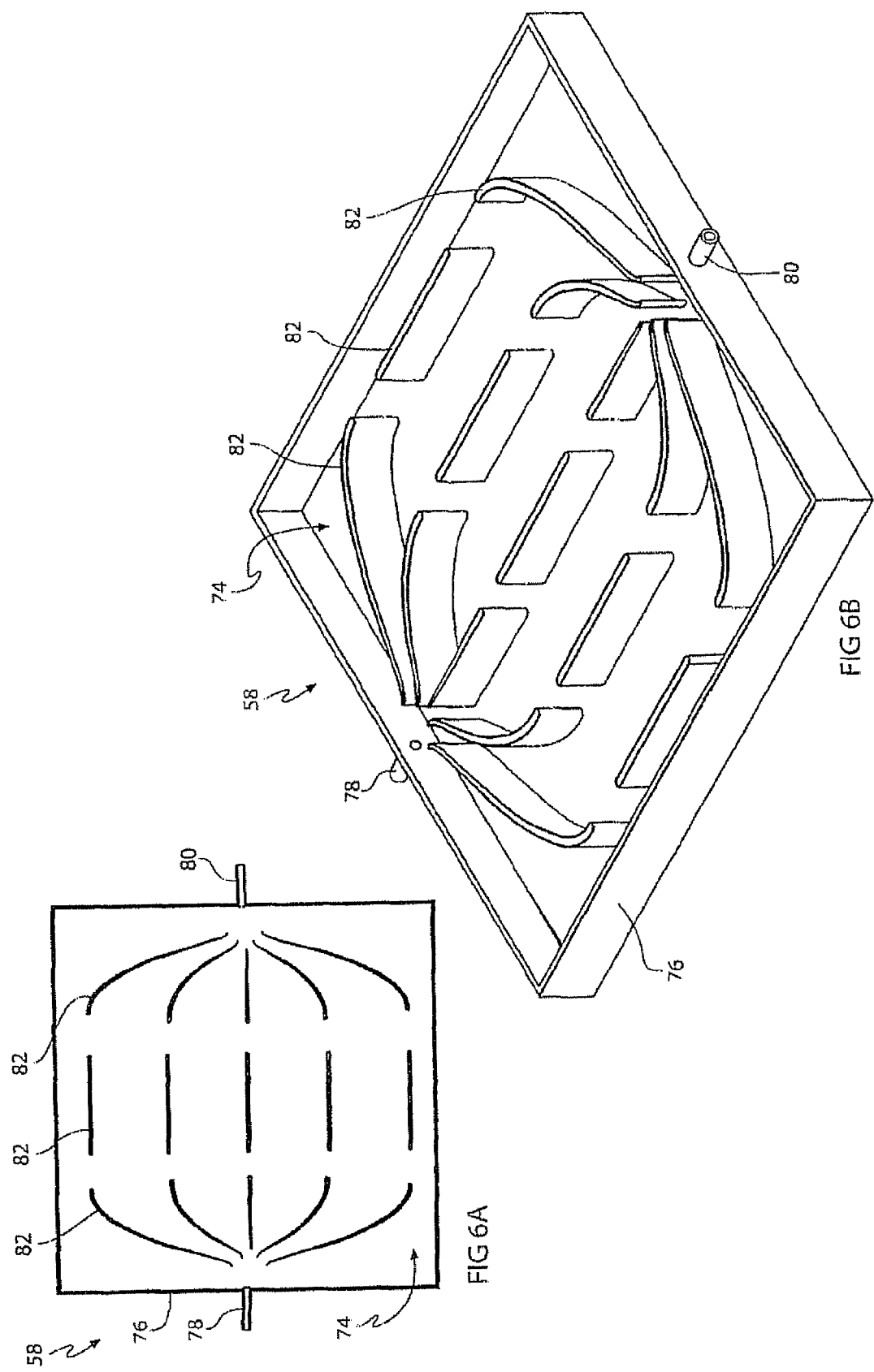

LAMINATING ASSEMBLY

CROSS-REFERENCE TO RELATED APPLICATION

This application is a national phase filing, under 35 U.S.C. §371(c), of International Application No. PCT/EP2010/054601, filed Apr. 7, 2010, the disclosure of which is incorporated herein by reference in its entirety.

FEDERALLY SPONSORED RESEARCH OR DEVELOPMENT

Not Applicable

BACKGROUND

The present invention relates to a lamination plant, a carrier assembly for temporary accommodating solar cell laminates while conveyed through a lamination plant, a method of carrying solar cell laminates through a lamination plant and a method of transporting a carrier though a lamination plant.

Solar cells are well known in the art of energy production for producing electrical energy in an efficient and environmentally friendly way. A solar cell relies on the photovoltaic effect for generating electrical energy from visual radiation which primarily but not necessarily constitutes solar light. A typical solar cell consists of a thin silicon (Si) wafer, hereafter designated solar cell element, having a single large p-n junction applied on its upper surface which is intended to face the light. Both the upper surface and the opposite back surface of the solar cell is provided with a metal contact constituting a plus and a minus pole for generating a direct current (DC) through the solar cell element. The photons impinging on the p-n junction will excite charge carriers, which will initiate a current towards their respective poles. Solar cells may be manufactured in varying sizes and geometries.

The DC output current may be used directly for powering a facility or charging a rechargeable battery, or alternatively a rectifier may be employed to convert the DC current to an AC current, which may be delivered to a transmission grid. The above type of solar cell element yields a maximum voltage of between 0.3V-0.7V and typically 0.5V. The voltage is weakly dependent on the amount of radiation received by the solar cell. The above applications typically need to be provided with a higher voltage than the voltage delivered by a single cell. Therefore, to be able to achieve higher voltages, a plurality of solar cell elements have to be connected in series to form a solar module. Due to the very low voltage provided by each individual solar cell element, the solar modules may be manufactured including a large amount of solar cell elements. For example, in a typical commercial solar module for a nominal voltage of 60V, 144 solar cell elements may be connected in series. Typically a plurality of modules is further connected into a solar array and installed in places subjected to high solar radiation intensity.

Since the solar cell element is typically very brittle and may rupture when subjected to shocks, the solar cell elements must be encapsulated within a protective enclosure. As the solar modules are mostly located outdoors and on exposed locations such as on rooftops etc., the enclosure must be made substantially rigid. For providing improved structural strength to the solar module, the solar cell elements are typically encapsulated between two protective cover layers of substantially rigid material. The upper protective layer facing the source of solar radiation must be made of transparent material such as glass or alternatively a transparent polymeric material for allowing the solar radiation to reach the solar cell elements. The lower protective layer facing away from the source of solar radiation may be made of transparent material or alternatively a non-transparent material, i.e. an opaque material which may be reflective for allowing incoming radiation to reflect and pass the solar cell elements a second time.

The solar cell elements are permanently encapsulated between the upper layer and the lower layer to form a solar laminate. The upper and lower cover layers should have a certain thickness for giving the solar cell the rigidity required for the location where the solar laminate is to be installed. However, for reducing the weight of the solar module, the covering layers must not be too thick. A thick upper cover layer will additionally absorb a large quantity of the solar radiation, thereby making the solar module less effective. Typically, the thickness of the cover layers is in the mm range.

The upper and lower protective layers are typically permanently fixed onto the solar cell elements by an adhesive. Typically, a thin film of EVA (Ethylene-Vinyl Acetate), is used as an adhesive in the manufacturing of solar laminates. EVA film is flexible and non-adhesive at room temperature and is commercially available in the form of rolls. At a temperature of about 80° C. the EVA film melts, and at a temperature of about 130° C. the EVA film cures by polymerization. The solar cell laminate may constitute a layer of one or more solar cell elements fixed between the two protective cover layers where the film of EVA material is placed between the solar cell elements and each protective cover layer for encapsulating the layer of solar cell elements and fixing the layer of solar cell elements to the cover layers. The solar cell laminate is processed by heating for the EVA film to melt and subsequently cure. After curing the EVA film will form a solid, transparent and insulating adhesive which permanently encapsulates the solar cell elements between the cover layers.

During the heating of the solar laminate and in particular during the melting and curing of the EVA material, gas bubbles will occur within the solar laminate. The lamination process is therefore typically performed under vacuum conditions for removing any gas bubbles which may occur during heating. During processing, the solar laminate is placed on a heating plate and positioned inside a vacuum chamber under vacuum conditions. Vacuum is in the present context understood to mean a pressure significantly below ambient pressure. The heating plate is heated to a temperature of at least 80° C. for the EVA material to melt and encapsulate the solar cell elements. When the EVA material has reached liquid state, bubble evacuation is performed. During bubble evacuation gas bubbles generated inside the solar laminate by the melted EVA are allowed to escape. Additionally, an external force is applied onto the solar laminate and a certain time period is allowed to elapse for ensuring all gas bubbles dissipating into the vacuum chamber. Any gas bubbles remaining inside the solar laminate may cause incoming solar radiation to deflect. Additionally, since bubbles inside the solar laminate constitute voids, the structural stability of the solar laminate may be reduced and the insulating properties of the EVA material may be adversely affected by the bubbles.

When bubble evacuation has been performed and the EVA material is substantially bubble free, the temperature of the heating plate is increased to about 130° C. to initiate curing. The curing causes the EVA material to crosslink and thereby permanently fixes the solar cell elements to the cover layers. When the curing step is finished a permanently sealed solar module in the form of a laminate is formed. After curing, the solar laminate may be removed from the vacuum chamber and allowed to cool down to ambient temperatures.

The use of heating plates in solar applications is well known in the prior art. One example of a heating plate is found in the European patent EP 1 517 585, which discloses a heating plate having internal cavities in which a heat exchange medium and heating bodies are located. Another example may be found in the German patent application DE 10 584 034 64 describing a heating plate having at least one main heating area and at least one auxiliary heating area being heated independently from the main heating area. Yet a further example of a heating plate may be found in the German utility model DE 20 587 006 464.

Typically, the layers of the solar laminate are assembled on the heating plate outside the vacuum chamber. The layers constitute solid sheets in ambient conditions (room-temperature). The heating plate is subsequently introduced into the vacuum chamber. The current activities in the field of BIPV (Building Integrated PhotoVoltaic) have increased the demand for solar laminates having a large surface. These large surfaced solar laminates having a large active surface for receiving solar radiation are used in large solar modules/arrays and are typically mounted on buildings. Some manufacturing plants exist which produce solar laminates having an active surface of several $m^2$. Since the solar laminates comprise glass and silicon, the weight of a single laminate may be considerable when the active area is in the $m^2$ range. Therefore the solar laminate and the heating plate is typically conveyed on a conveying surface into the lamination plant, e.g. by the use of rollers, conveyer belts or the like. It has however been observed that the use of rollers and conveyer belts are not suitable for moving the large surfaced solar laminates, since the solar laminates are still brittle before curing and may thus easily break from shocks received during transport through the lamination plant. Such shocks are typically the result of increased friction between the conveying surface and the heating plate. Increased friction may occur when the opposing conveying surfaces are uneven. The opposing conveying surfaces are typically uneven due to manufacturing tolerances and material defects, thus shocks are difficult to eliminate. For avoiding frequent breakage of non-cured solar laminates there is a need for improved conveying and transportation devices in connection with the transport of the solar cell laminate through the lamination plant. It is therefore an object of the present invention to provide a carrier assembly suitable for both transporting and heating the solar laminates in the lamination plant.

SUMMARY

The above need and object together with numerous other needs, objects and advantages which will be evident from the below detailed description of a preferred embodiment of the module according to the present invention, are according to a first aspect of the present invention obtained by carrier assembly for temporary accommodating one or more solar cell laminates while said solar laminates are conveyed through a lamination plant, said solar cell laminate comprising:

a solar cell layer of silicon material, an upper and a lower encapsulating layer of EVA material covering the top and bottom of said solar cell layer, an upper and lower protective layer covering said upper and lower encapsulating layer, respectively, said encapsulating layer having a specific melting temperature and a specific curing temperature, said melting temperature being lower than said curing temperature, and said carrier assembly comprising:

a carrier housing of heat conductive material defining an inner volume, said carrier housing having an upper plate adapted for receiving said solar cell laminate and an opposite lower plate defining a first plurality of apertures, said inner volume including one or more connecting elements interconnecting said first and second plates, an air supply system for providing a continuous outward airflow through said first plurality of apertures when said lower plate is received on a conveying surface of said lamination plant, said airflow yields an elevated and substantially balanced air pressure on said lower plate for providing lift or buoyancy to said carrier housing allowing a substantially friction-free movement of said carrier housing in relation to said conveying surface of said lamination plant, and a thermal transfer system providing thermal energy to said upper plate for allowing said encapsulating layer to melt and subsequently cure and preferably is adapted to provide a temperature on said upper plate of 80-130° C.

It is contemplated that the lower plate of the carrier assembly has a surface substantially corresponding to the conveying surface of the lamination plant. The lower plate and the conveying surfaces are preferably both flat surfaces; however, one or both of the surfaces may comprise a track or guiding plates or the like for assisting the manoeuvring of the carrier housing. It is further evident that surface unevenness relating to the material or manufacturing tolerances is allowed.

The thermal transfer system is arranged to receive energy, such as electrical energy or a substance exhibiting a high thermal energy, from an external source and distribute the thermal energy on the upper plate. For flat solar laminates, the thermal transfer system typically constitutes a separate heating plate in a stationary position inside the lamination plant used for heating the carrier housing of the carrier assembly, e.g. via the lower plate. For achieving a high-energy efficiency, the heating plate typically always maintains a high temperature and the temperature of the upper surface may be caused to assume a suitable temperature profile via the carrier housing. The inner volume is supported by connecting elements, which may constitute a rim or pillar structure connecting the upper and lower plates, or alternatively constitute a single body. The inner volume may exhibit a heat capacity for allowing the upper plate to heat up in a suitable time frame, such as a few minutes, for achieving a suitable temperature profile for allowing the EVA sheet of the solar laminate to melt and cure. Especially for the above type of carrier assembly, the carrier housing must enter the lamination plant quickly for allowing a uniform temperature profile of the upper plate and avoid uneven melting and curing within one solar laminate or between several separate solar laminates positioned on the same upper plate which may be caused by the laminate entering the lamination plant at a slow pace.

The air supply system preferably comprises a pipe system connected to the apertures in the lower plate for conducting high-pressurised air from an external source to the apertures. The apertures should be spread over the lower plate to achieve a balanced pressure distribution.

The solar laminate is preferably assembled directly on the upper plate of the carrier assembly when the carrier assembly is placed at a first end of the conveying surface of the lamination plant. The upper plate should have an upper surface corresponding to the surface of the solar laminate for the contact area between the solar laminate and the upper plate to be maximised and avoiding air pockets between the upper plate and the solar laminate for optimizing the thermal energy conduction from the upper plate into the solar laminate and achieving an even temperature distribution inside the solar laminate. Typically, the upper plate is flat for accommodating standard flat solar modules. When the solar laminate is being assembled, the air supply system may be deactivated or the air flow interrupted, so that the carrier housing rests in a stable position on the conveying surface for accurately assembling the heavy solar cell element layer and cover layers.

When the laminate is ready to be transported into the lamination plant, the air supply system is started and pressurised air is allowed to flow through the apertures in the lower plate. The pressurised airflow impinges onto the conveying surface and is redirected towards the edge of the lower plate, which causes an elevated pressure between the conveying surface and the lower plate. The elevated pressure, which is construed to be elevated in relation to the ambient pressure, causes lift or buoyancy to the carrier housing by providing an "air cushion" between the lower plate and the conveying surface. The airflow should be provided continuously with substantially constant flow intensity for allowing a stable hovering of the carrier housing.

Surprisingly it has been discovered that by letting the carrier housing be supported by an air cushion, the friction between the conveying surface of the lamination plant and the carrier housing may be substantially eliminated. Since the carrier housing is lifted a small distance above the conveying surface, any minor unevenness between the lower plate and the conveying surface does not influence the friction. Thus, the cause of shocks during transport is effectively eliminated. As an additional advantage, the carrier housing will be very easy to handle and move due the very low friction between the lower plate and the conveying surface and thus the carrier housing may in some embodiments even be manoeuvred by hand thereby excluding the provision of a propulsion device such as a motor. In another embodiment the propulsion may be achieved by compressed air, a small electrical motor or the like. In a typical embodiment the carrier housing is caused to lift about 0.5-1 cm above the conveying surface for avoiding any unevenness around 1 mm, which is the typical size of unevenness and protrusions in the lower plate or conveying surface relating to the material or manufacturing tolerances.

When the carrier housing has assumed the proper position inside the lamination plant and the carrier housing is ready for heating, the air supply system is stopped and any hoses supplying pressurised air are removed. Preferably, the airflow is interrupted slowly to allow a smooth descent of the carrier housing for reducing the shock applied to the solar laminate when the lower plate contacts the conveying surface. It is contemplated that snap-on connectors of the well known "Gardena" type or similar may be used for rapid connection and disconnection of the air supply system. When preparations have been made for initiating the melting and subsequent curing of the encapsulating layer, the heat transfer system may be activated for providing thermal energy to the upper plate of the carrier housing of the carrier assembly. The carrier housing or at least the first plate should be made of heat conductive material such as metal for allowing the first plate to assume a temperature of preferably at least 80° C., more preferably 100° C., for melting the EVA material and preferably at least 130° C., more preferably 150° C., for allowing the EVA material to cure after bubble evacuation has been performed. In this context it is contemplated that other encapsulation materials than EVA material may occasionally be used and such materials having different melting temperatures and curing temperatures. Provided a material other than EVA is occasionally chosen, it is contemplated that the temperatures provided to the first plate may be variable according to the specific material chosen. The thermal transfer system should be adapted to provide an evenly distributed temperature over the compete upper plate so that the encapsulating film melts and subsequently cures substantially evenly for avoiding partial melting or partial curing of the solar laminate. Partial melting or partial curing would lead to solar laminate layer parts being non-adhesive, which would cause voids by bubbles and/or delamination.

After the curing has been performed, the solar laminate may be taken out of the lamination plant and cooled down to ambient temperature. To speed up the cooling of the solar laminates, the thermal transfer system may optionally be equipped to provide rapid cooling to the upper plate e.g. by allowing a cooling fluid from an external source to circulate though the carrier housing. A faster cooling may increase the total throughput of solar laminates by the lamination plant. The rapid cooling may increases the risk of the solar laminate rupturing due to thermal forces. Thus, the intensity of the rapid cooling must be limited and it must be ensured that the cooling is applied uniformly on the solar laminate. For reducing the risk of rupturing the solar laminate is preferably fixed during cooling In a further embodiment according to the first aspect of the present invention, said thermal transfer system is being accommodated in said carrier housing. The carrier housing may have an inner volume between the upper and lower plate for accommodating the thermal transfer system. The thermal transfer system may constitute conduits for allowing thermal oil to circulate near the upper plate, or alternatively electrical conduits allowing direct electrical heating of the upper plate. Direct electrical heating of the upper plate may be especially useful for non-flat solar laminates for allowing a more even temperature distribution.

In a further embodiment according to the first aspect of the present invention, said upper plate further comprising a second plurality of apertures connected to said air supply system providing a continuous outwardly airflow through said second plurality of apertures when said solar laminate is received on said upper plate or said carrier housing, said airflow yields an elevated and substantially balanced air pressure on said upper plate for providing lift or buoyancy to said solar laminate allowing a substantially friction free movement of said solar laminate in relation to said carrier housing and/or for allowing rapid cooling said solar laminate by said airflow, preferably by cooling said solar laminate from about 150° C. to below about 40° C. within 4-10 minutes. Typically, the sheets making up the solar laminate are assembled by stacking them onto the carrier housing either by hand or by means of a lifting apparatus. By providing an air cushion above the carrier housing the position of the solar laminate on the carrier housing may be altered, since the airflow will cause the solar laminate to lift. Additionally, the sheets of glass or silicon material, which are brittle, may be placed on a soft air cushion instead of directly onto the upper plate, which is typically made of rigid metal. Preferably, the air supply system may have a first mode in which airflow is provided through the upper plate and a second mode in which the airflow is provided through the lower plate, or alternatively airflow is provided through both the upper and lower plates.

Typically, the carrier housing and the solar laminate has to be cooled down right after the curing from about 150° C. to below about 40° C. within 4-10 minutes. In the prior art, cooling of the laminate was achieved by including pins into the upper plate for elevating the solar laminate and allowing heat to dissipate to the surrounding air by natural convection. According to the present embodiment, the airflow and air cushion may alternatively or in addition to providing lift to the solar laminate be used for rapid cooling of the solar laminate. The airflow should typically have a temperature of no more than room temperature and be applied at a high pressure for allowing an efficient temperature reduction of the solar laminate by forced convection which has been showed to be much more efficient than natural convection.

In a further embodiment according to the first aspect of the present invention, said upper plate comprises one or more shallow grooves for individually receiving one or more of said solar cell laminates. By having a groove for accommodating the solar cell laminate, the positioning of the solar laminate is simplified and any misalignment of the solar laminate is avoided. In some embodiments according to the first aspect, the upper plate may have a multitude of shallow grooves for accommodating the same multitude of laminates individually and separately in relation to each other, thereby avoiding the risk of adhesion between the individual laminates. The groove should have a depth corresponding to the thickness of the solar laminate and its bottom should preferably form a substantially flat surface for accommodating the solar laminate.

In a further embodiment according to the first aspect of the present invention, said thermal transfer system comprises a heat conductive fluid such as thermal oil and where said carrier housing comprises one or more fluid inlets and one or more fluid outlets communicating with said heat transfer system. A heat conductive fluid such as thermal oil of high temperature may be introduced into the inner volume of the carrier housing through the fluid inlet and deliver thermal energy to the upper plate. The thermal oil may preferably be delivered to the fluid inlet pre-heated and leave the carrier housing through the outlet and return to an external heating system. Preferably, the external heating system includes a pump for providing a constant flow of heated thermal oil though the heating system of the carrier housing and a heating system for achieving a suitable temperature of the thermal oil. The flow properties of the thermal transfer system of the carrier housing may be optimised for heat exchange with the upper plate. It is contemplated that in a separate cooling mode, the oil may be cooled for rapid cooling of the solar laminate after the lamination process is finished.

In a further embodiment according to the first aspect of the present invention, said connecting elements constitute flow guiding elements for distributing said heat conductive fluid inside said carrier housing. For an optimal temperature distribution on the upper plate, the connecting elements between the upper and lower plates may be used for guiding the flow of the thermal oil within the inner volume so that the flow intensity is roughly identical over the surface of the upper plate and any flow recirculation within the inner volume is avoided. The shape of the individual connecting elements may therefore vary. Preferably, the connecting elements are made of a material having low flow resistance, such as PTFE (Teflon).

In a further embodiment according to the first aspect of the present invention, said connecting elements and/or said upper plate may be electrically heated. The connecting elements may be electrically heated by heating bodies integrated into the connecting elements. The heating bodies are preferably powered from an external power source. By heating the connecting elements the thermal oil is not required to be externally heated. Alternatively, the upper plate is heated directly by integrated resistors or a resistive sheet.

In a further embodiment according to the first aspect of the present invention, the thermal properties of said thermal transfer system and said carrier housing causes the temperature of said upper plate to increase from 80-130° C. in a time period of at least 10 minutes, preferably at least 15 minutes and more preferably at least 20 minutes, for providing sufficient time for allowing any gas bubbles accommodated within the solar laminate to escape. For allowing the solar laminate sufficient time for all gas bubbles to dissipate, the encapsulation layer should preferably remain in its molten and non-cured state for at least 10-20 minutes, and thereafter the polymerisation and curing may initiate. In some embodiments the thermal transfer system may exhibit a dual temperature mode, e.g. by in a first stage providing a temperature of at least 80° C. but not above 130° C. for allowing the encapsulation layer to melt and when the above time period has elapsed the temperature is increased to at least 130° C. for initiating the polymerisation and curing of the encapsulating layer. However, due to the thermal inertia of the upper plate and the heat transfer system it is often not possible to achieve a rapid change of temperature of the upper plate. In a particular embodiment, the thermal heat capacity of the upper plate and the thermal conductivity of the thermal transfer system are adapted so that the upper plate is subjected to a substantially uniform temperature increase from 80° C. to 130° C. during the above time period for allowing the temperature to distribute over the upper plate and at the same time avoiding premature polymerisation.

In a further embodiment according to the first aspect of the present invention, said upper plate is undulated for accommodating an undulated laminate, such as a BIPV (Building Integrated PhotoVoltaic). For standard photovoltaic applications the solar laminate is typically flat, thus the upper plate should be flat as well. However, for some BIPV applications, undulated solar laminates are required due to technical or architectural reasons. For undulated solar laminates a flat upper plate would not be suitable due to the air pocket between the solar laminate and the upper plate as was previously discussed.

For undulated laminates preferably a customised carrier housing is used having an upper plate exhibiting the same undulation as the solar laminate.

In a further embodiment according to the first aspect of the present invention, said carrier housing defines a substantially box-shaped structure having a length of about 3 meters, a width of about 4 meters and a height of about 0.1 meters. The carrier housing according to the present invention is preferably used in connection with a large lamination plant for laminating large solar laminates. In the present context a large solar laminate is construed to mean any solar laminate which due to its size and weight is impracticable to lift by hand. It may alternatively mean a set of solar laminates which together are impracticable to lift by hand. Such large solar laminates may be advantageously handled by a carrier housing having the above measurements.

The above need and object together with numerous other needs, objects and advantages which will be evident from the below detailed description of a preferred embodiment of the module according to the present invention, are according to a second aspect of the present invention obtained by a method of conveying one or more solar cell laminates through a lamination plant by providing a carrier housing, said solar cell laminate comprising:

a solar cell layer of silicon material, an upper and a lower encapsulating layer of EVA material covering the top and bottom of said solar cell layer and an upper and lower protective layer covering said upper and lower encapsulating layer, respectively, said encapsulating layer having a specific melting temperature and a specific curing temperature, said melting temperature being lower than said curing temperature, and said carrier assembly comprising:

a carrier housing of heat conductive material defining an inner volume, said carrier housing having an upper plate adapted for receiving said solar cell laminate and an opposite lower plate defining a first plurality of apertures, said inner volume including one or more connecting elements interconnecting said first and second plates, a thermal transfer system providing thermal energy to said upper plate said thermal transfer system being accommodated in said inner volume, an air supply system for providing a continuous outward airflow through said first plurality of apertures, said method comprising the steps of:

receiving said lower plate of said carrier housing on a conveying surface of said lamination plant and temporarily accommodating said solar cell laminates on said upper plate of said carrier housing, elevating and substantially balancing the air pressure on said lower plate for providing lift or buoyancy to said carrier housing by said airflow of said air supply system, moving substantially friction-free said carrier housing in relation to said conveying surface of said lamination plant, and increasing the temperature on said outer surface of said first plate to preferably 80-130° C. for allowing said encapsulating layer to melt and subsequently cure.

It is evident that the above method according to the second aspect may be used together with the system according to the first aspect.

The above need and object together with numerous other needs, objects and advantages which will be evident from the below detailed description of a preferred embodiment of the module according to the present invention, are according to a third aspect of the present invention obtained by a method of laminating and conveying one or more solar laminates by providing a lamination plant, said solar laminate comprising a solar cell layer of silicon material, an upper and a lower encapsulating layer of EVA material covering the top and bottom of said solar cell layer and an upper and lower protective layer covering said upper and lower encapsulating layer, respectively, and said lamination plant comprising a frame extending horizontally from a first end to a second end and defining in a vertical direction a processing level and a carrier return level, said frame comprising:

a loading station located at said first end and being positionable in said processing level and said carrier return level and shiftable between said levels, a processing station comprising a sealable vacuum chamber located adjacent to said loading station at said processing level and, an unloading station located adjacent to said processing station at said second end and being positionable in said processing level and said carrier return level and shiftable between said levels, and a return station located between said loading station and said unloading station at said carrier return level, said lamination plant further comprising a carrier for accommodating said solar laminate, said carrier having a heating element and being placeable in any of said loading station, processing station, unloading station and return station, said method further comprising performing the steps of:

preparing said carrier by positioning said loading station in said processing level, placing said carrier in said loading station and accommodating said solar laminate on said carrier, processing said laminate by placing said carrier in said vacuum chamber, evacuating said vacuum chamber and exhibiting said solar laminate to heat by said heating element, unloading said solar laminate by positioning said unloading station in said processing level, placing said carrier in said unloading station and removing said solar laminate from said carrier, and returning said carrier by positioning both said loading and unloading stations in said carrier return level and moving said carrier from said unloading station to said loading station via said return station.

For achieving high quality solar laminates the lamination process requires costly equipment such as vacuum chambers, heating plates etc. The lamination method according to the third aspect of the present invention may improve the usage of the vacuum chambers and other equipment.

The loading station, the processing station and the unloading station defines the conveying direction of the solar laminate and should be arranged adjacent to each other in the above order. The conveying direction preferably defines a straight line, however, other conveying directions are possible. The particular conveying direction is related to the factory floor area. The solar laminate has the same structure as described above in connection with the first aspect of the present invention.

The lamination plant is built on the frame and defines the horizontal conveying direction from the first end to the second end. In the vertical direction the frame defines the processing level and the carrier return level. The processing level is preferably located below the carrier return level, however, it's equally feasible to arrange the processing level above the carrier return level. The loading station and the unloading station are both shiftable between the processing level and the carrier return level. The shifting between the levels may be performed e.g. by a hydraulic lift or the like. The loading station may be used for manually or automatically assembling the solar laminate. The unloading station may consequently be used for manually or automatically removing the solar laminate from the carrier. In some embodiments further stations may be provided before the loading station and/or after the unloading station, e.g. a testing station or a packing station. The processing station includes the vacuum chamber and the carrier should be able to fit into the vacuum chamber. The vacuum chamber should include a vacuum pump for evacuating air and other gases resulting from the lamination process from the interior of the vacuum chamber. Suitable pressures for inside the vacuum chamber when evacuation has been performed range from about 0.1 mbar to about 1 mbar, and typically 0.5 mbar, for achieving sufficient bubble evacuation in the solar laminate when the solar laminate is being heated. The vacuum chamber will typically include connectors for allowing the heating plate to receive thermal energy, e.g. electrical energy or thermal oil, for allowing the carrier to heat up.

The carrier is being delivered with the lamination plant as an accessory and is reusable, i.e. when the solar laminates have been removed from the carrier at the unloading station the carrier should be transported back to the loading station for being reloaded with non-processed laminates. For optimal usage of factory floor area, the lamination plant may accommodate several carriers, i.e. a first carrier may be loaded at the loading station while a second carrier performs lamination in the processing station and a third carrier is being unloaded at the unloading station. Thus, the carrier at the unloading station typically cannot return to the loading station via the processing station, since it would cause an obstruction by going against the solar laminate conveying direction. Instead, the carrier will be shifted to the carrier return level and transported back to the loading station via the return station.

The individual stations (i.e. the loading station, the processing station, the unloading station and the return station) should be capable of temporarily accommodating the carrier and conveying the carrier to the subsequent station. For this purpose a conveying belt, conveying chain or conveying wheels may be used. In a particular advantageous embodiment according to the present invention the carrier may be of the same type as the carrier according to the first aspect, however, other carriers may be used as well. The heating element should be included in the carrier for heating at least the upper surface of the carrier which is facing the solar laminate. The carrier may e.g. be electrically heated or heated by thermal oil, as previously has been discussed.

It is further contemplated that additional processing levels and/or return levels may be installed in the frame. Since the standard laminates are substantially flat, the stations may be shallow and thus it may be contemplated that the lamination plant may be realised as a multilevel lamination tower having a multitude of processing levels. A multitude of processing levels permits the installation of the same multitude of lamination stations for allowing parallel lamination and thereby increasing the total throughput of laminates through the lamination plant without increasing the need for factory floor area.

In a further embodiment according to the third aspect of the present invention, said processing station further comprising a pressure chamber being separated from said vacuum chamber by a flexible membrane, said solar laminate being located between said carrier and said flexible membrane and when said pressure chamber is evacuated, said flexible membrane is caused to contact said solar laminate by the pressure difference between said pressure chamber and said vacuum chamber thereby fixing said solar laminate between said carrier and said flexible membrane. During bubble evacuation there is a risk of misalignment between the sheets of the solar laminate, caused by thermal expansion and flow effects in the sheets of the solar laminate. For achieving a correct alignment and positioning of the solar laminate and a quick bubble evacuation, the solar laminate should preferably be fixed during the processing. For this purpose preferably a flexible membrane is used. The flexible membrane should be made of temperature resistant and pressure tight material such as rubber or the like. When the vacuum chamber is evacuated the pressure inside the pressure space causes the flexible membrane to expand and apply a pressure onto the solar laminate so that the solar laminate is fixed between the carrier and the flexible membrane.

In a further embodiment according to the third aspect of the present invention, said frame further comprising a cooling station located between said processing station and said unloading station at said processing level, said method including the additional step of cooling said solar laminate by introducing said carrier into said cooling station and actively drawing heat from said solar laminate. After curing, the solar laminate is allowed to cool to room temperature. By providing a separate cooling station between the processing station and the unloading station, the solar laminate may be allowed to cool before unloading. The cooling station includes an active cooling which preferably includes cooling of the carrier, which due to the heat conductive properties of the carrier may rapidly cool the solar laminate to room temperature. In this way the production efficiency may be increased since the time needed for cooling is reduced. Rapid cooling may involve introducing chilled thermal oil into the carrier or subjecting the laminate to an air cushion as described above.

The above need and object together with numerous other needs, objects and advantages which will be evident from the below detailed description of a preferred embodiment of the module according to the present invention, are according to a fourth aspect of the present invention obtained by a lamination plant for laminating and conveying one or more solar laminates, said solar laminate comprising a solar cell layer of silicon material, an upper and a lower encapsulating layer of EVA material covering the top and bottom of said solar cell layer and an upper and lower protective layer covering said upper and lower encapsulating layer, respectively, and said lamination plant comprising a carrier for accommodating said solar laminate and a frame extending horizontally from a first end to a second end and defining in a vertical direction a processing level and a carrier return level, said frame comprising:

a loading station located at said first end and being positionable in said processing level and said carrier return level and shiftable between said levels, when in said processing level a processing station comprising a sealable vacuum chamber located adjacent said loading station at said processing level and, an unloading station located adjacent said processing station at said second end and being positionable in said processing level and said carrier return level and shiftable between said levels, and a return station located between said loading station and said unloading station at said carrier return level, said carrier having a heating element and being placeable in any of said loading station, processing station, unloading station and return station.

It is evident that the lamination plant according to the fourth aspect of the present invention may be used together with any of the systems and methods according to the first, second and third aspects of the present invention.

BRIEF DESCRIPTION OF THE DRAWINGS

A brief description of the figures follows below:

FIG. 1 is a lamination plant for processing solar laminates.

FIG. 5*a-b* are views of an air supply system of a carrier.

FIG. 6*a-b* are views of a thermal oil supply of a carrier.

DETAILED DESCRIPTION

Figure 2A:
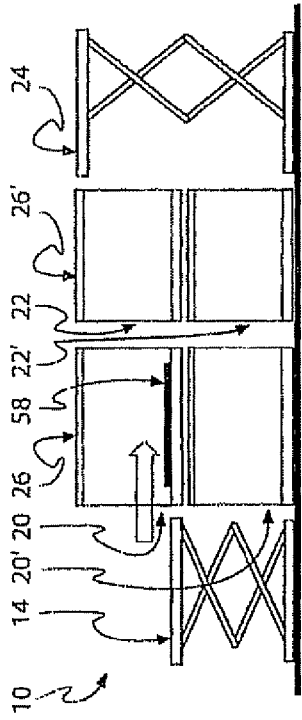
FIG. 2 is a series describing a conveying path of a carrier in a lamination station.

The present invention will now be described in more detail with reference to the figures. Words such as upper, lower, above, below, top bottom etc should be understood in relation to the figures.

FIG. 1 shows a lamination plant 10 according to the present invention. The lamination plant 10 comprises a frame structure 12 which is divided into several stations: a loading station 14 is accommodated at the first end of the frame structure 12. The loading station 14 comprises a flat conveying platform 16 which is vertically movable by a lift 18. The conveying platform 16 of the loading station 14 is movable between a lower level, a middle level and an upper level, which will be described in more detail in connection with FIG. 2. A carrier 58 is accommodated on the conveying platform 16. The carrier 58 is heatable during the processing of the solar laminate. A solar laminate 48 is accommodated on the carrier 58. The solar laminate 48 and the carrier 58 will be described in greater detail in connection with FIG. 3. The conveying platform 16 of the loading station 14 is located adjacent to a processing station 20. The processing station 20 comprises a vacuum chamber (not shown) which will be described in detail in connection with FIG. 3. An optional auxiliary processing station 20' is provided below the main processing station 20. The carrier 58 may enter the processing station 20 from the loading station when the loading station has been elevated to the middle level as shown. A cooling station 22 is located adjacent to the processing station 20. An optional auxiliary cooling station 22' is provided below the main cooling station 22. The cooling station 22 is used for temporarily accommodating the solar laminate 48 and the carrier 58 after processing for allowing the solar laminate 48 to chill down to room temperature. At the second end of the frame structure 12, adjacent to the cooling station 22 an unloading station 24 is located. The unloading station resembles the loading station and defines a conveying platform 16' and a lift 18'.

The auxiliary processing and cooling stations 20', 22' are optionally provided on the lower level for parallel processing of several solar laminates 48 or alternatively as a backup in case of a breakdown of the main processing and cooling stations 20 22.

The solar laminate conveying direction is thus defined on the middle level from the loading station 14, via the processing station 20, the cooling station 22 to the unloading station 24, or alternatively on the lower level from the loading station 14, via the auxiliary processing station 20', the auxiliary cooling station 22' to the unloading station 24. On top of the frame structure 12, and above the processing and cooling stations 22, 24 on the top level a respective return station 26, 26' is located. The return station is used for returning the carrier 58 to the loading station 14 when the solar laminates 48 have been unloaded at the unloading station 24. The carrier 58 is thereby transported in a direction opposite the conveying direction of the solar laminate 48 at the upper level, which will be further illustrated in connection with FIG. 2.

FIG. 2a-f show the conveying path of the carrier 58. The lamination plant 10 defines a conveying direction of the solar laminate 48 from the loading station 14 to the unloading station 24 at the middle level or alternatively the lower level. The carrier 58 defines a conveying path further comprising the return of the carrier from the unloading station 24 to the loading station 14 on the upper level.

FIG. 2a show the solar laminate 48 being assembled on the carrier 58, which in turn is accommodated on the conveying platform 16 of the loading station 14. The loading station 14 is presently at the lower level. The loading station 14 is subsequently elevated to the middle level to be adjacent to the processing station 20.

Figure 2B:
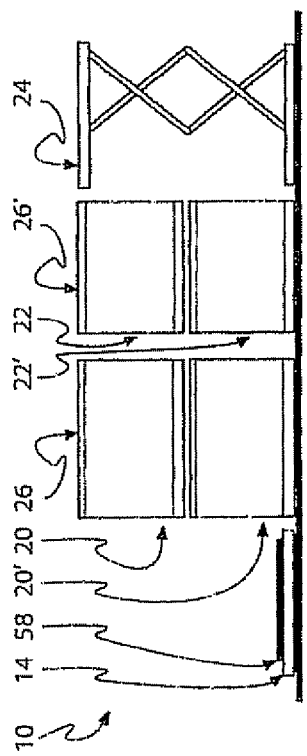

In FIG. 2b the carrier 58 and the solar laminate 48 is conveyed in the conveying direction indicated by the arrow into the processing station 20 for being processed. The processing of the solar laminate will be further discussed in detail in connection with FIG. 3.

Figure 2C:
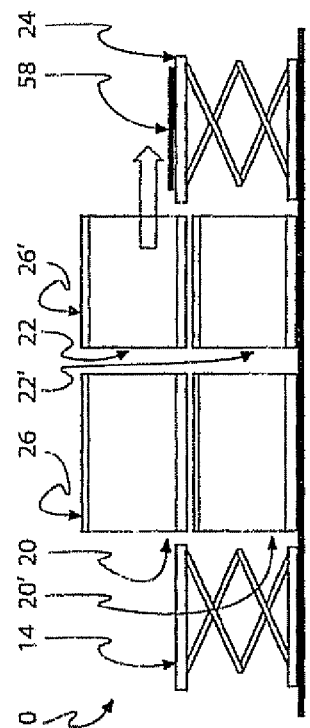

FIG. 2c shows the carrier 58 and the solar laminate 48 being conveyed in the conveying direction indicated by the arrow into the cooling station 22 for being chilled to room temperature.

Figure 2D:
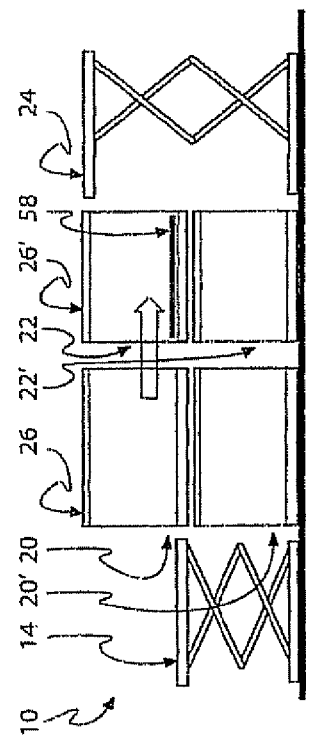

FIG. 2d shows the carrier 58 and the solar laminate 48 being conveyed in the conveying direction indicated by the arrow to the unloading station 24. The unloading station has previously been shifted to the middle level for being adjacent to the cooling station 22. At the unloading station 24 the solar laminate 48 is being unloaded.

Figure 2E:
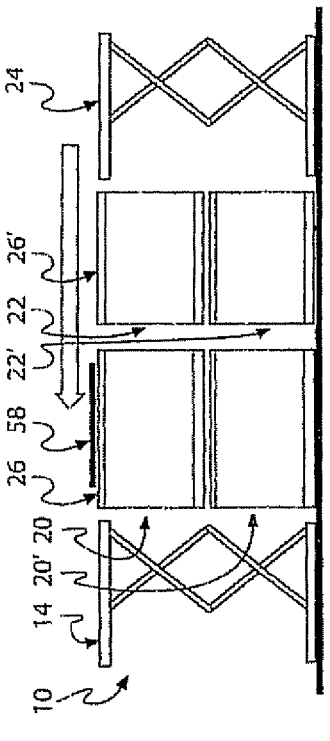

FIG. 2e shows the unloading station 24 being shifted to the upper level in direction of the arrow, while still accommodating the carrier 58.

Figure 2F:
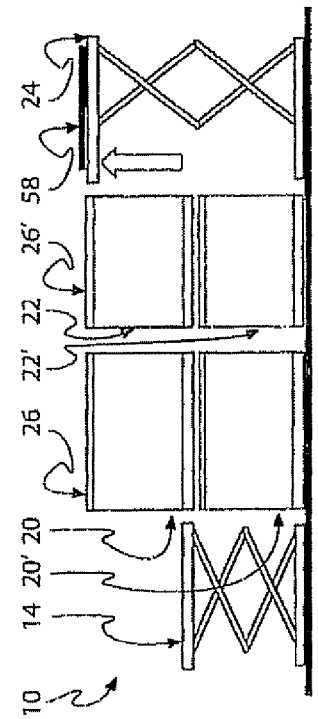

FIG. 2f shows the carrier 58 being temporarily accommodated in the return station 26 on the upper level while being conveyed in the direction of the arrow from the unloading station 24 to the loading station 14, both being at the upper level. When the carrier 58 is received in the loading station 14 the loading station 14 may be shifted back to the lower level for being reloaded with a new solar laminate 48 to be processed in the processing station 20.

The conveying surfaces in the stations are preferably flat for being used with the carrier 58 as described in FIG. 5a-b. In an alternative embodiment the conveying surfaces include belts, chains or wheels or providing a forward motion to the carrier. Preferably, several carriers 58 are being used simultaneously. The above configuration makes most efficient use of factory floor space and avoids the risk of empty carriers 58 obstructing the conveying direction of the solar laminate 48.

Figure 3A:
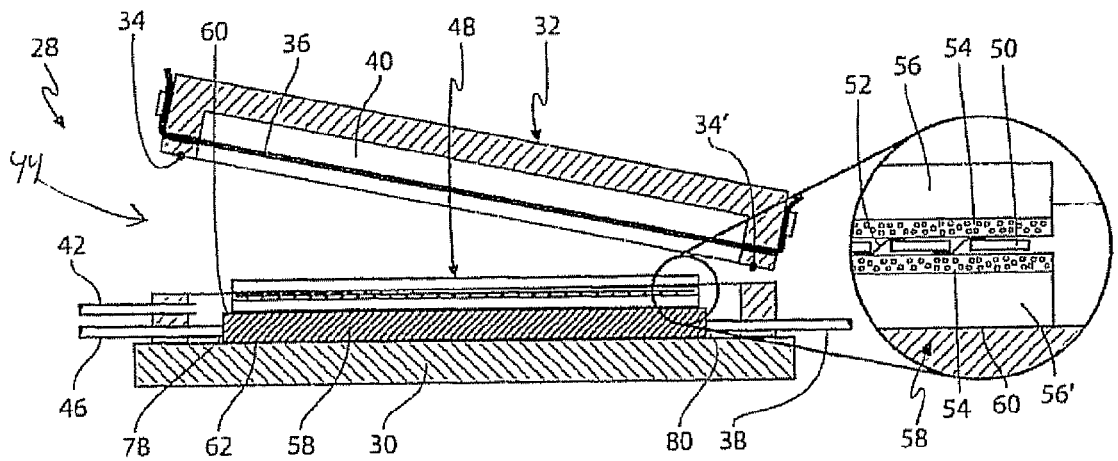
FIG. 3*a-c* are a series describing a lamination process inside a lamination station.

FIG. 3a shows a cut-out side view of a vacuum chamber 28. The vacuum chamber 28 is included in the processing station of the lamination plant shown in FIG. 1-2. The vacuum chamber is made of rigid metal and defines an inner space 44 for accommodating a carrier 58. The vacuum chamber comprises a base part 30 and a lid 32, which may be separated as indicated for receiving the carrier 58. A pressure seal 34 seals the interface between the lid 32 and the base plate 30 when the vacuum chamber 28 is closed. The upper surface of the base plate 30 forms a conveying surface for accommodating the lower plate 62 of the carrier 58 and receiving/delivering the carrier 58 from/to an adjacent station. The base plate 30 further comprises a thermal oil hose 46 which provides thermal oil from a source located outside the vacuum chamber 28 to the carrier 58 when the carrier is accommodated in the inner space 44 of the vacuum chamber. The thermal oil hose 46 is connected to the carrier 58 by a thermal oil inlet 78. Additionally, a thermal oil outlet 80 is provided in the carrier 58 opposite the thermal oil inlet 78 for allowing the thermal oil to leave the carrier 58. A thermal oil outlet hose 38 is connected to the thermal oil outlet 80 which allows the thermal oil to leave the vacuum chamber, reheat by an outside source and circulate the carrier 58 via the thermal oil hose 46.

Both the thermal oil hoses 46, 38 and the thermal oil inlet and outlet 78, 80 are reinforced to sustain the vacuum condition inside the vacuum chamber 28. The base plate 30 further comprises a vacuum hose 42 which is connected to a vacuum pump (not shown) located outside the vacuum chamber 28. The vacuum pump is used for evacuating the inner space 44 of the vacuum chamber 28. The ducts in the vacuum chamber 28 where the thermal oil hose 46 and the vacuum hose 42 are fed through should be made pressure-tight for avoiding any leakage from the outside into the inner space 44 of the vacuum chamber 28. The lid 32 of the vacuum chamber 28 defines a pressure space 40 being separated from the inner space 44 by a rubber membrane 36. The rubber membrane 36 is made substantially flexible but pressure resistant and heat resistant. Alternatively to thermal oil the upper plate may be electrically heated by providing electrical conduits, or yet alternatively the base plate 30 of the vacuum chamber 28 may be heated.

The solar laminate 48 is located in the inner space 44 on the upper plate 60 of the carrier 58 between the carrier 58 and the rubber membrane 36 of the lid 32. The solar laminate comprises a central layer of solar cell elements 50. The solar cell elements 50 comprise silicon wafers defining a single p-n junction which typically has an upwardly facing active surface for receiving solar radiation. The solar cell elements 50 are connected in a series configuration by a metallic connector grid 52. The solar cell elements 50 are covered on each side by a upper and lower layer of EVA 54, 54'. The EVA layers 54, 54' are in turn covered by an upper and lower cover 56, 56', respectively. The upper cover 56 is preferably made of glass for allowing solar radiation to penetrate without any substantial losses. The lower cover 56' may be made of glass, however preferably a metallic lower cover 56' is used.

Figure 3B:
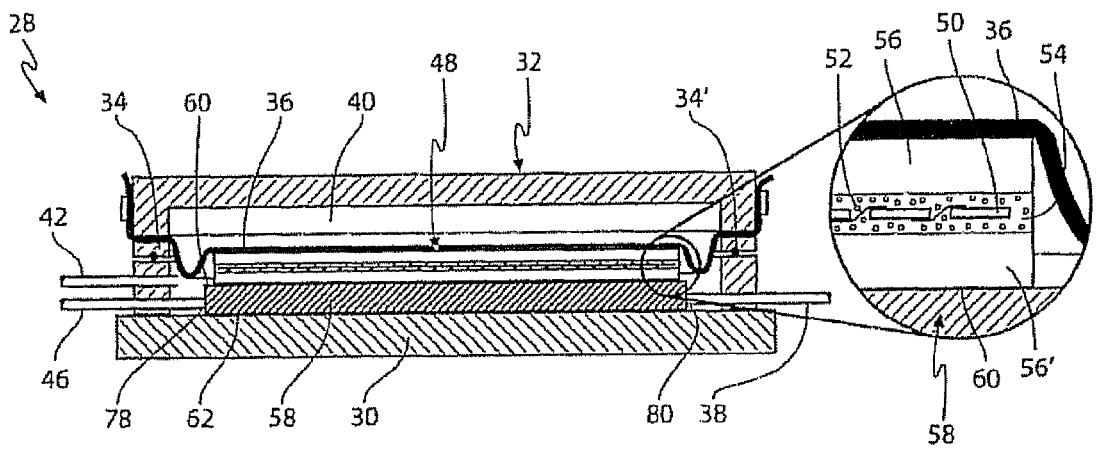

FIG. 3*b* shows the vacuum chamber 28 of FIG. 3*a* when the lid 32 has been attached to the base plate 30 and the inner space 44 has been evacuated by use of the vacuum hose 42. The pressure in the inner space 44 is in the range of 1 mbar to 0.1 mbar. When the inner space 44 is evacuated, the pressure space 40 will remain at ambient pressure and consequently the pressure difference will cause the rubber membrane 36 to expand towards the carrier 58 and apply a pressure on the solar laminate 48. The pressure applied by the rubber membrane 36 onto the solar laminate 48 will act as a fixation force for ensuring the solar laminate 48 remains in a correct position during the lamination process. The low pressure in the vacuum chamber 28 will remove any air pockets which may possibly exist within the solar laminate 48. In some embodiments the pressure in the pressure space 40 may be variable for allowing a variable force by the rubber membrane 36.

The lamination process is initiated by introducing hot thermal oil into the carrier 58. The thermal oil is preferably allowed to circulate, which will be further explained in FIG. 6. The temperature of the thermal oil may be around 150° C. The thermal oil will heat the carrier 58 and the overlying laminate 48. The high temperature will cause the EVA layers 54, 54' to assume a liquid state and due to the pressure from the rubber membrane 36 the liquid EVA 54 will fill any space between the solar cell elements 50 and between the covers 56, 56' to completely encapsulate the central layer. During the heating phase gas bubbles will accumulate within the solar laminate 48, mainly within the liquid EVA 54. Due to the low pressure inside the inner space 44 and the pressure applied from the rubber membrane 36 the gas bubbles will dissipate from the solar laminate provided the 10-20 minute time frame is allowed for the process before curing is initiated. A bubble-free laminate is essential for a high quality solar module.

Figure 3C:
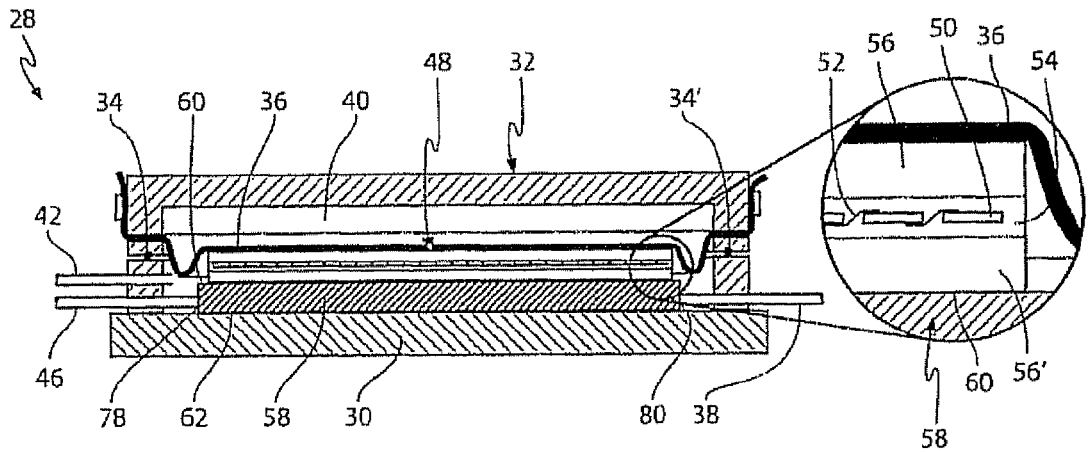

FIG. 3*c* shows the vacuum chamber 28 of FIG. 3*b* when curing has been initiated. The carrier preferably has thermal properties for allowing the temperature of the solar laminate to increase from 80° C. to 130° C. during the above-mentioned 10-20 minutes. When the liquid EVA 54 reaches 130° C. curing by polymerisation is initiated. The curing solidifies the EVA layer 54 and fixes the covers 56, 56' permanently to the layer of solar cell elements 50. The EVA material forms a substantially transparent, dielectric and temperature resistant encapsulating layer inside the solar laminate 48. After the curing has finished, the solar laminate 48 should be allowed to cool down to room temperature. Rapid cooling may be provided by allowing chilled thermal oil to enter and circulate the carrier 58 and/or by subjecting the solar laminate to an air cushion. The fixation force by the rubber membrane 36 prevents cracking of the solar laminate due to thermal stress. When the solar laminate 48 has assumed room temperature, the inner space 44 is re-pressurised and the rubber membrane 36 is allowed to resume its non-expanded state. Subsequently, the lid 32 may be opened and the processed solar laminate 48 may be removed.

Figure 4A:
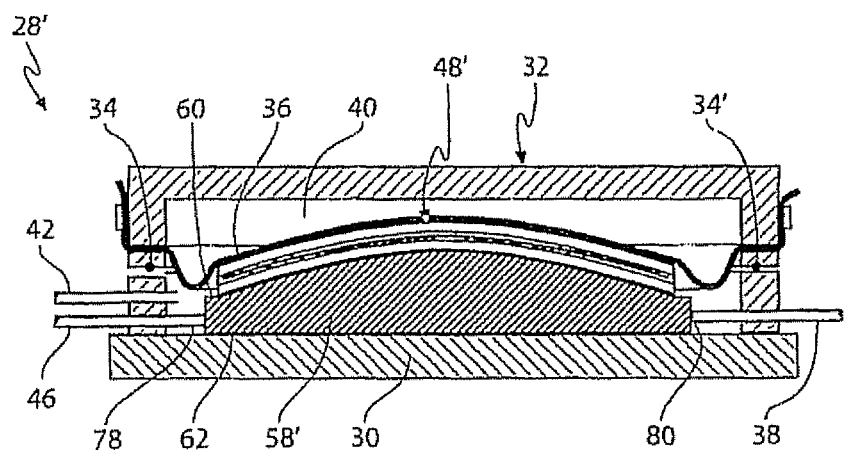
FIG. 4*a-c* are close-up views of alternative embodiments of a carrier.

FIG. 4*a* shows a cut-out side view of the vacuum chamber 28' including a further embodiment of the carrier 58'. The carrier 58' has an upper plate 60 exhibiting a convex undulation for accommodating a laminate 48' having a corresponding concave undulation for allowing good thermal conduction into the solar laminate 48'. Such laminates 48' may typically be used for BIPV.

Figure 4B:
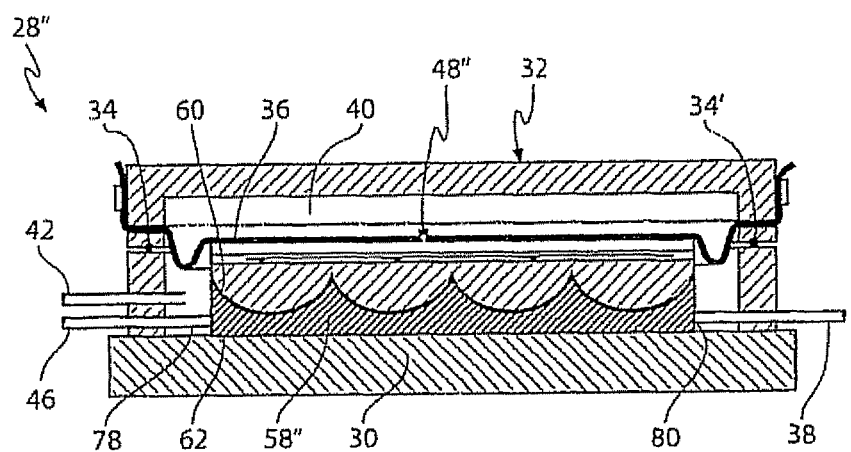

FIG. 4*b* shows a cut-out side view of the vacuum chamber 28" including a further embodiment of the carrier 58". The carrier 58" has an upper plate 60 exhibiting a number of concave undulations for accommodating a laminate 48" having corresponding convex undulations for allowing good thermal conduction to the solar laminate 48". Such laminates 48" may typically feature a reflective lower cover 56" allowing incoming solar radiation to be focused on specific points within the solar laminate 48" where a solar cell element may be accommodated.

Figure 4C:
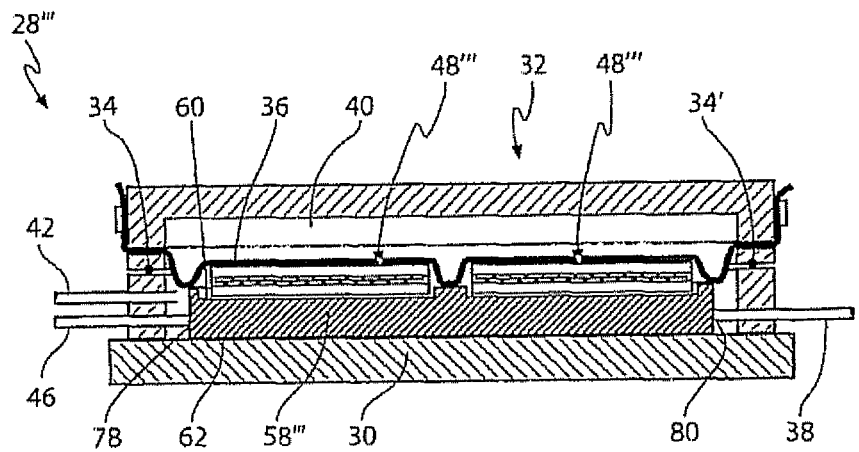

FIG. 4*c* shows a cut-out side view of the vacuum chamber 28''' including a further embodiment of the carrier 58'''. The carrier 58''' has an upper plate 60 exhibiting a number of shallow cavities constituting slots for accommodating a smaller solar laminate 48'''. In this way the solar laminates 48''' are sidewardly supported, well positioned and additionally the risk of several smaller laminates attaching each other is avoided.

FIG. 5*a* shows a cut-out side view of a carrier 58. The carrier 58 has lower and upper air inlet 64, 64' for receiving compressed air from an external source (not shown). The compressed air is distributed inside the carrier 58 by a lower and upper air pipe 66, 66' and leaves the carrier 58 by a number of apertures 68, 68 in the respective lower and upper plate 60, 62 of the carrier 58. When the carrier 20 is accommodated on a flat conveying surface (not shown) and is about to be moved, a constant flow of compressed air is propagated through the lower air pipe 66 and the lower apertures 68 for achieving an air cushion having an increased pressure at the lower plate 62 of the carrier 58 when the airflow is deflected between the lower plate 62 of the carrier 58 and the conveying surface. The increased pressure on the lower plate 62 will apply an upwardly force for elevating the carrier 58 about 1 cm above the conveying surface. When the carrier 58 is elevated, the carrier 58 may be moved easily even by hand.

When a heavy solar laminate (not shown) is placed on or removed from the upper plate 60 of the carrier 58, compressed air may be propagated through the upper air pipe 66' and the upper apertures 68'. In this way an air cushion having an increased pressure will form between the solar laminate and the upper plate 60 of the carrier 58 and thereby the solar laminate may be positioned very easily, even by hand. The air cushion also provides rapid cooling of the solar laminate. Typically, the carrier 58 and the solar laminate have to be cooled down right after the curing is finished. The flow of cold compressed air will provide efficient cooling by forced convection and typically allow the solar laminate to cool down from the curing temperature of 130° C.-150° C. to a temperature not exceeding 40° C. within no more than 4-10 minutes after curing is finished.

FIG. 5*b* shows a perspective view of the carrier 58 as shown in FIG. 5*a*. The apertures 68 in the lower and upper plates 60, 62 should be distributed evenly over the surface of the plates 60, 62 for providing stability and the airflow should be substantially constant and uniform. In some embodiments a skirt (not shown) made of rubber may be employed as a rim encircling the lower plate 62 of the carrier 58 for allowing less air to escape from the air cushion and thus a less amount of compressed air must be provided to the carrier 58. The present embodiment may optionally include a thermal transfer system or alternatively be heated by a separate heating plate.

For illustrative purposes the carrier 58 is shown here having a separate air supply hose 70 connected to each air pipe (not shown), and each air pipe supplies a row of apertures 68.

The air hoses 70 are all connected to a joint compressor 72 generating a flow of compressed air though each air supply hose 70. The air supply hoses 70 are connected to the air inlet 64 of the carrier by snap-on connectors for allowing rapid connection when the carrier 58 is about to be moved and rapid disconnection when the carrier 58 is accommodated inside the vacuum chamber (not shown). It is of course contemplated that in some embodiments a single air supply hose 70 may be used for the distribution of air to each of the apertures 68 for allowing rapid connection and disconnection of the air supply hose 70.

FIG. 6a shows a top cut-out view and FIG. 6b shows a cut-out perspective view of the carrier 58. The carrier 58 has an inner volume 74 for receiving thermal oil. The inner volume 74 is defined by a rim 44 and by the upper and lower plates 8 (not shown in the present perspective) of the carrier 58. The rim further accommodates the thermal oil inlet 78 and an oppositely located thermal oil outlet 80. The inner volume 74 further defines guiding elements 82 connecting the upper and lower plates of the carrier 58. The guiding elements 82 function as flow deflectors for allowing the flow of thermal oil to distribute over the complete upper plate of the carrier 58. The guiding elements 82 further provoke turbulence, which enhances the thermal conductivity towards the upper plate of the carrier 58. Suitable temperature of the thermal oil is about 150° C. for allowing the EVA layer of the solar laminate (not shown) to melt and subsequently cure.

Figure 7A:
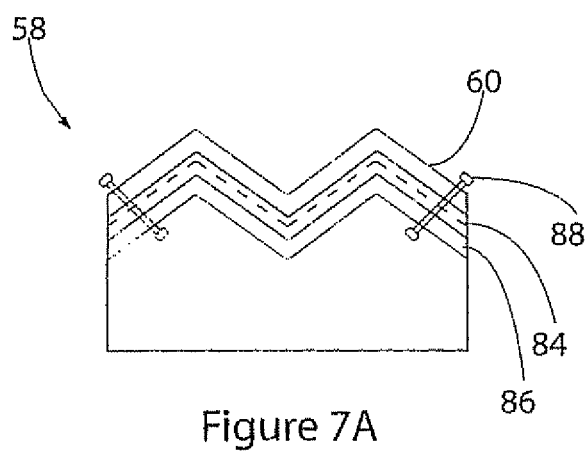
FIG. 7*a-b*—are further embodiments of the carrier having direct electrical heating without thermal oil.

FIG. 7a shows a cut-out view of a further embodiment of a carrier 58 having direct electrical heating. The carrier 58 comprises an upper surface 60 which is undulated and which rests on a metal sheet 86. Alternatively, Teflon may be used instead of metal. Between the upper surface 60 and the metal sheet 86 an electrical heating sheet 84 is located. The electrical heating sheet may comprise a flexible and resistive sheet which may be heated by electricity. Such sheets are known in the art and commercially available from various companies, such as the Danish company JEVI. For allowing a high thermal transfer rate between the electrical heating sheet 84 and the upper surface 60, the upper surface 60 and the metal sheet 86 should be fixed together by bolts 88, or alternatively screws.

By omitting the thermal oil and providing direct heating by electricity a separate heating plate may be omitted for allowing the upper surface 60 to heat-up quicker and a better controlled temperature profile to be achieved. This is especially important for undulated solar laminates.

Figure 7B:
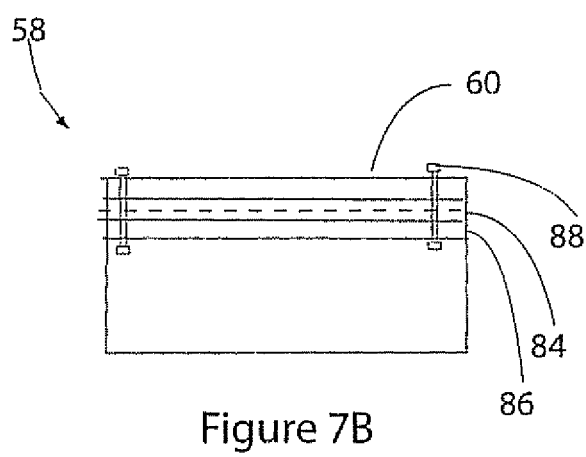

FIG. 7b shows a cut-out view of a further embodiment of a carrier 58 similar to FIG. 7a. The present embodiment features a flat upper surface 60 for accommodating a flat solar laminate. It is contemplated that a separate heating plate may be used in combination with a thermal transfer system inside the carrier. The thermal transfer system in the carrier may provide a pre-heating of about 60° to the solar laminate for shortening the time needed for lamination.

A carrier according to the present invention allows the solar laminates to be introduced quickly into the lamination plant for ensuring a uniform heating.

List of parts with reference to the FIGURES:

10. Lamination plant
12. Frame structure
14. Loading station
16. Conveying platform
18. Lift
20. Processing station -continued List of parts with reference to the FIGURES:

22. Cooling station
24. Unloading station
26. Return station
28. Vacuum chamber
30. Base plate
32. Lid
34. Pressure seal
36. Rubber membrane
38. Thermal oil outlet hose
40. Pressure space
42. Vacuum hose
44. Inner space
46. Thermal oil hose
48. Solar laminate
50. Solar cell element (Silicon wafer)
52. Connector grid
54. EVA layer
56. Cover layer
58. Carrier
60. Upper surface (of carrier)
62. Lower surface (of carrier)
64. Air inlet
66. Air pipe
68. Apertures
70. Air supply hose
72. Compressor
74. Inner volume (of carrier)
76. Rim
78. Thermal oil inlet
80. Thermal oil outlet
82. Guiding elements
84. Electrical heating sheet
86. Metal sheet
88. Bolt

The invention claimed is:

1. A carrier assembly for temporarily accommodating one or more solar cell laminates while said solar laminates are conveyed through a lamination plant having a conveying surface, wherein each of said solar cell laminates comprises a solar cell layer of silicon material, upper and lower encapsulating layers of EVA material covering the top and bottom of said solar cell layer, upper and lower protective layers covering said upper and lower encapsulating layers, respectively, said encapsulating layers having a specific melting temperature and a specific curing temperature, said melting temperature being lower than said curing temperature, said carrier assembly comprising:
a carrier housing of heat conductive material defining an inner volume, said carrier housing having an upper plate adapted for receiving said solar cell laminates and an opposite lower plate defining a first plurality of apertures, said inner volume including one or more connecting elements interconnecting said first and second plates;
an air supply system for providing a continuous outward air flow through said first plurality of apertures when said lower plate is received on the conveying surface of said lamination plant, wherein said airflow yields an elevated and substantially balanced air pressure on said lower plate for providing lift or buoyancy to said carrier housing allowing a substantially friction-free movement of said carrier housing in relation to said conveying surface of said lamination plant; and
a thermal transfer system providing thermal energy to said upper plate for allowing said encapsulating layer to melt and subsequently cure, said thermal transfer system being operable to provide a temperature on said upper plate of 80-130° C.

2. The carrier assembly according to claim 1, wherein said thermal transfer system is accommodated in said carrier housing.

3. The carrier assembly according to claim 1, wherein said upper plate further comprising a second plurality of apertures connected to said air supply system providing a continuous outwardly airflow through said second plurality of apertures when said solar laminate is received on said upper plate of said carrier housing, wherein said airflow yields an elevated and substantially balanced air pressure on said upper plate for providing lift or buoyancy to said solar laminate, thereby allowing a substantially friction free movement of said solar laminate in relation to said carrier housing.

4. The carrier assembly according to claim 1, wherein said upper plate comprises one or more shallow grooves for individually receiving one or more of said solar cell laminates.

5. The carrier assembly according to claim 1, wherein said thermal transfer system comprises a heat conductive fluid and wherein said carrier housing comprises one or more fluid inlets and one or more fluid outlets communicating with said heat transfer system.

6. The carrier assembly according claim 5, wherein said connecting elements constitute flow guiding elements for distributing said heat conductive fluid inside said carrier housing.

7. The carrier assembly according to claim 1, wherein at least one of said connecting elements and said upper plate is electrically heated.

8. The carrier assembly according to claim 1, wherein the thermal properties of said thermal transfer system and said carrier housing cause the temperature of said upper plate to increase from 80-130° C. in a time period sufficient for allowing any gas bubbles accommodated within the solar laminate to escape.

9. The carrier assembly according to claim 1, wherein said upper plate is undulated for accommodating an undulated laminate.

10. The carrier assembly according to claim 9, wherein said undulated laminate is a BIPV (Building Integrated PhotoVoltaic).

11. The carrier assembly according to claim 1, wherein said carrier housing defines a substantially box-shaped structure having a length of about 3 meters, a width of about 4 meters, and a height of about 0.1 meter.

12. A method of conveying one or more solar cell laminates through a lamination plant having a conveying surface by providing a carrier assembly, wherein each of said solar cell laminates comprises a solar cell layer of silicon material, upper and lower encapsulating layers of EVA material covering the top and bottom of said solar cell layer, upper and lower protective layers covering said upper and lower encapsulating layers, respectively, said encapsulating layers having a specific melting temperature and a specific curing temperature, said melting temperature being lower than said curing temperature, said carrier assembly comprising:

a carrier housing of heat conductive material defining an inner volume, said carrier housing having an upper plate adapted for receiving said solar cell laminate and an opposite lower plate defining a first plurality of apertures, said inner volume including one or more connecting elements interconnecting said first and second plates;

a thermal transfer system providing thermal energy to said upper plate, said thermal transfer system being accommodated in said inner volume;

an air supply system for providing a continuously outward airflow through said first plurality of apertures;

said method comprising the steps of:

receiving said lower plate of said carrier housing on said conveying surface of said lamination plant and temporarily accommodating said solar cell laminates on said upper plate of said carrier housing;

elevating and substantially balancing the air pressure on said lower plate for providing lift or buoyancy to said carrier housing by said airflow of said air supply system;

moving substantially friction-free said carrier housing in relation to said conveying surface of said lamination plant; and increasing the temperature on said upper plate to 80-130° C. for allowing said encapsulating layer to melt and subsequently cure.

13. A method of laminating and conveying one or more solar laminates by providing a lamination plant, each of said solar laminates comprising a solar cell layer of silicon material, upper and lower encapsulating layers of EVA material covering the top and bottom of said solar cell layer, upper and lower protective layers covering said upper and lower encapsulating layers, respectively, said lamination plant comprising a frame extending horizontally from a first end to a second end and defining in a vertical direction a processing level and a carrier return level vertically spaced from said processing level, said frame comprising:

a loading station located at said first end and vertically shiftable between said processing level and said carrier return level;

a processing station comprising a sealable vacuum chamber located adjacent to said loading station at said processing level;

an unloading station located adjacent to said processing station at said second end and vertically shiftable between said processing level and said carrier return level; and a return station located between said loading station and said unloading station at said carrier return level;

said lamination plant further comprising a carrier for accommodating said solar laminate, said carrier having a heating element and being placeable in any of said loading station, processing station, unloading station and return station, said method further comprising performing the steps of:

preparing said carrier by positioning said loading station in said processing level;

placing said carrier in said loading station and accommodating said solar laminate on said carrier;

processing said laminate by placing said carrier in said vacuum chamber;

evacuating said vacuum chamber and exposing said solar laminate to heat by said heating element;

unloading said solar laminate by positioning said unloading station in said processing level;

placing said carrier in said unloading station and removing said solar laminate from said carrier; and returning said carrier by positioning both said loading and unloading stations in said carrier return level and moving said carrier from said unloading station to said loading station via said return station.

14. The method according to claim 13, wherein said processing station further comprises a pressure chamber being separated from said vacuum chamber by a flexible membrane, said solar laminate being located between said carrier and said flexible membrane and when said pressure chamber is evacuated, said flexible membrane is caused to contact said solar laminate by the pressure difference between said pressure chamber and said vacuum chamber thereby fixing said solar laminate between said carrier and said flexible membrane.

15. The method according to claim 13, wherein said frame further comprises a cooling station located between said processing station and said unloading station at said processing level, said method including the additional step of cooling said solar laminate by introducing said carrier into said cooling station and actively drawing heat from said solar laminate.

16. A lamination plant for laminating and conveying one or more solar laminates, each of said solar laminates comprising a solar cell layer of silicon material, upper and lower encapsulating layers of EVA material covering the top and bottom of said solar cell layer, upper and lower protective layers covering said upper and lower encapsulating layers, respectively, said lamination plant comprising a carrier for accommodating said solar laminate and a frame extending horizontally from a first end to a second end and defining in a vertical direction a processing level and a carrier return level vertically spaced from said processing level, said frame comprising:
    a loading station located at said first end and being vertically shiftable between said processing level and said carrier return level;
    a processing station comprising a sealable vacuum chamber located adjacent said loading station at said processing level;
    an unloading station located adjacent said processing station at said second end and vertically shiftable between said processing level and said carrier return level; and
    a return station located between said loading station and said unloading station at said carrier return level;
said carrier having a heating element and being placeable in any of said loading station, processing station, unloading station and return station.

17. The carrier assembly according to claim 1, wherein said upper plate further comprising a second plurality of apertures connected to said air supply system providing a continuous outwardly airflow through said second plurality of apertures when said solar laminate is received on said upper plate of said carrier housing, wherein said airflow provides a cooling of said solar laminate.

18. The carrier assembly according to claim 17, wherein said air supply system is operable to provide an airflow through said second plurality of apertures that is sufficient to cool said solar laminate from about 150° C. to below about 40° C. within 4-10 minutes.

\* \* \* \* \*